United States Patent
Jung

(10) Patent No.: US 8,183,664 B2
(45) Date of Patent: May 22, 2012

(54) ELECTROSTATIC DISCHARGE PROTECTION DEVICE, METHOD OF MANUFACTURING THE SAME, METHOD OF TESTING THE SAME

(75) Inventor: Ji-Houn Jung, Jongno-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 388 days.

(21) Appl. No.: 12/502,261

(22) Filed: Jul. 14, 2009

(65) Prior Publication Data
US 2010/0013515 A1 Jan. 21, 2010

(30) Foreign Application Priority Data
Jul. 16, 2008 (KR) .................. 10-2008-0069125

(51) Int. Cl.
*H01L 29/00* (2006.01)

(52) U.S. Cl. ............... 257/510; 438/427; 257/E21.548

(58) Field of Classification Search .................. 257/510, 257/E21.548; 438/424, 427, 700
See application file for complete search history.

(56) References Cited

U.S. PATENT DOCUMENTS

| 6,870,201 B1 * | 3/2005 | Deboy et al. ............... 257/170 |
| 2006/0043480 A1 * | 3/2006 | Tsuchitani et al. ........... 257/341 |

* cited by examiner

*Primary Examiner* — David Vu
(74) *Attorney, Agent, or Firm* — Sherr & Vaughn, PLLC

(57) ABSTRACT

An electrostatic discharge protection device, a method of manufacturing the same, and a method of testing the same. The electrostatic protection device includes a plurality of device isolation regions formed in a semiconductor substrate at a predetermined width and a predetermined depth that each sequentially increase from a circuit device formation region of the semiconductor substrate to a ground region of the semiconductor substrate, a plurality of gate electrodes formed over the semiconductor substrate in spaces between adjacent ones of the device isolation regions, and a plurality of source regions and drain regions formed in the semiconductor substrate at both lateral sides of the gate electrode.

13 Claims, 2 Drawing Sheets

Figure 1:
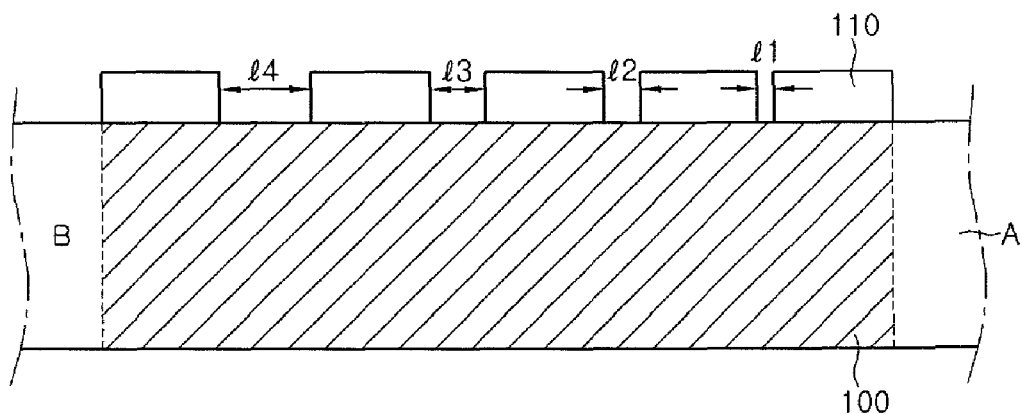

ELECTROSTATIC DISCHARGE PROTECTION DEVICE, METHOD OF MANUFACTURING THE SAME, METHOD OF TESTING THE SAME

The present application claims priority under 35 U.S.C. §119 to Korean Patent Application No. 10-2008-0069125, filed on Jul. 16, 2008, which is hereby incorporated by reference in its entirety.

BACKGROUND

Exposure to an electrostatic discharge (ESD) may cause damage to the internal circuits of electronic components used in communication devices. ESD is caused when an electronic device contacts an object capable of transferring electric charges, static electricity is discharged to influence a circuit. For example, ESD may occur when a human body contacts an antenna or an external connector part of a communication device.

In order to protect internal circuits from ESD, an electronic circuit is equipped with an electrostatic protection device. The electrostatic protection device may be realized with a semiconductor device such as a transistor. For example, if the electrostatic protection device is realized using a metal oxide semiconductor field effect transistor (MOSFET), a gate insulation layer is formed on and/or over a channel region between a source region and a drain region, and a gate electrode is formed on and/or over the gate insulation layer.

Since the gate insulation layer has a very thin thickness of several tens of Å to several hundreds of Å, it has a tendency to be easily broken even when a current of more than several tens of V flows. Therefore, a transistor may lose its function as a electrostatic protection device. Particularly, although static electricity has high voltage and low current characteristics, the gate insulation layer of a transistor has a lattice structure that can be easily broken at a voltage level of static electricity. Additionally, different electrostatic protection devices need to be provided based on current characteristics of various circuit devices, and also the durability of the electrostatic protection device is deteriorated due to frequent exposures to an overcurrent. At the product development stage, if the reliability of an electrostatic protection device is tested, it is difficult to predict its durability. Additionally, there is limitation in enhancing the degree of integration of an electrostatic protection device because it is connected to a circuit device as an external device through an additional mounting process. Moreover, the electrostatic protection device differentially operates in accordance with an overcorrect occurring at the inside and outside thereof.

SUMMARY

Embodiments relate to an electrostatic protection device which effectively handles an overcurrent of various voltage levels which is applied to various kinds of circuit devices as one kind of the electrostatic protection device.

Embodiments relate to an electrostatic protection device which enhances the counteraction for an overcurrent of an overvoltage through a sequential multi-level structure.

Embodiments relate to a method of manufacturing an electrostatic protection device which may be formed in the same device region as a circuit device through a single semiconductor process, thereby enhancing the overall degree of integration of a device.

Embodiments relate to a method of testing an electrostatic protection device which can detect a level of an overcurrent by a measuring signal of a gate electrode and performing the reliability test and durability calculation of the electrostatic protection device more accurately.

Embodiments relate to a method of manufacturing an electrostatic protection device that may include at least one of the following: forming a plurality of trenches in a semiconductor substrate having depths that sequentially increase from one side of the semiconductor substrate to the other side of the semiconductor substrate; and then forming a plurality of device isolation regions in the semiconductor substrate by filling the trenches with an insulation layer; and then forming a plurality of gate electrodes on and/or over the semiconductor substrate in spaces between adjacent device isolation regions; and then forming a plurality of source regions and drain regions at both lateral sides of each gate electrode.

Embodiments relate to a method of manufacturing an electrostatic protection device that may include at least one of the following: forming a plurality of trenches spaced apart a predetermined distance over a semiconductor substrate, the depth of the trenches sequentially increasing from a first region of the semiconductor substrate to a second region of the semiconductor substrate; and then forming a plurality of device isolation regions in the semiconductor substrate by filling the trenches with an insulation layer material; and then forming a plurality of gate electrodes spaced apart over the semiconductor substrate and between the adjacent device isolation regions; and then forming a plurality of source regions and drain regions in the semiconductor substrate at both lateral sides of each one of the gate electrodes.

Embodiments relate to an electrostatic protection device that may include at least one of the following: a plurality of device isolation regions formed in a semiconductor substrate at depths that sequentially increase from one side of the semiconductor substrate to the other side of the semiconductor substrate; a plurality of gate electrodes formed on and/or over the semiconductor substrate in spaces between adjacent device isolation regions; and a plurality of source regions and drain regions formed at both lateral sides of each gate electrode.

Embodiments relate to an electrostatic protection device that may include at least one of the following: a semiconductor substrate having a first region and a second region; a plurality of device isolation regions formed in the semiconductor substrate at a predetermined width and a predetermined depth that each sequentially increase from the first region of the semiconductor substrate to the second region of the semiconductor substrate; a plurality of gate electrodes formed over the semiconductor substrate in spaces between adjacent ones of the device isolation regions; and a plurality of source regions and drain regions formed in the semiconductor substrate at both lateral sides of the gate electrode.

Embodiments relate to a method of testing the electrostatic protection device that may include at least one of the following: classifying an overcurrent applied to a circuit device formation region of a semiconductor device; and then measuring a signal of a gate electrode of the semiconductor device by repeatedly applying an overcurrent of an arbitrary level to the circuit device region; and then counting the number of applied overcurrents as a measuring signal of the gate electrode is changed; and then evaluating reliability of the electrostatic protection device using a level of the overcurrent and the number of the applied overcurrents at each measuring signal as an evaluation criteria.

Embodiments relate to a method of testing the electrostatic protection device that may include at least one of the following: applying an overcurrent to a circuit device formation region of a semiconductor device; and then classifying the overcurrent; and then measuring a signal of a gate electrode of the semiconductor device by repeatedly applying an overcurrent of an arbitrary level to the circuit device region; and then counting the number of applied overcurrents as a measuring signal of the gate electrode is changed; and then evaluating reliability of the electrostatic protection device using a level of the overcurrent and the number of the applied overcurrents at each measuring signal as an evaluation criteria.

DRAWINGS

Example FIGS. 1-4 illustrate an electrostatic protection device and a method of manufacturing an electrostatic protection device, in accordance with embodiments.

DESCRIPTION

In the description of embodiments, it will be understood that when a layer (or film), region, pattern or structure is referred to as being "on" or "under" another layer (or film), region, pad or pattern, the terminology of "on" and "under" includes both the meanings of "directly" and "indirectly." Further, the reference about "on" and "under" each layer will be made on the basis of drawings.

As illustrated in example FIG. 1, a method of manufacturing an electrostatic protection device may include forming a plurality of photoresist patterns 110 on and/or over semiconductor substrate 100 of an electrostatic protection device. In order to form photoresist patterns 110, a photoresist material is applied on and/or over semiconductor substrate 100 such as a single crystal silicon substrate. Reticle alignment, development, and exposure processes are then performed to form photoresist pattern 110. Photoresist patterns 110 are formed spaced apart a predetermined lateral distance "l" to expose the uppermost surface of semiconductor substrate 100. The predetermined lateral distance l which sequentially increases from device formation region A of semiconductor substrate 100 where various circuit devices connected to the electrostatic protection device are formed to ground region B which is a ground region of semiconductor substrate 100. For instance, lateral distance $l_4$ is greater than $l_3$, lateral distance $l_3$ is greater than lateral distance $l_2$ and lateral distance $l_2$ is greater than lateral distance l.

Figure 2:
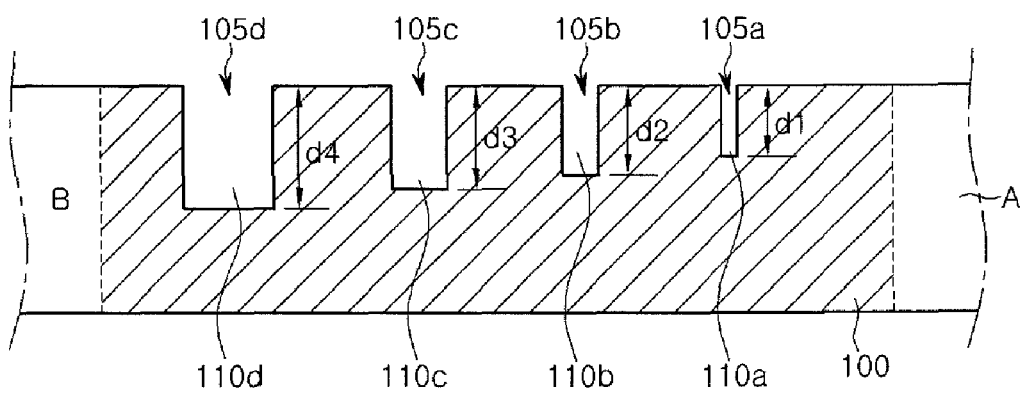

As illustrated in example FIG. 2, an etching process is conducted on semiconductor substrate 100 using photoresist patterns 110 as masks to form plurality of trenches 105 including first trench 105a, second trench 105b, third trench 105c and fourth trench 105d spaced apart lateral distance l in the semiconductor substrate 100 of the electrostatic protection device. The etching process can be performed using a dry etching technique such as, for example, reactive ion etching (RIE). The respective widths of trenches 105 formed in semiconductor substrate 100 are substantially the same as lateral distances l, and thus, sequentially increase from device formation region A to ground region B.

A narrow region among substrate regions exposed through holes of photoresist patterns 110 has a lower etch rate than a wide region. This is due to a track deviation of ion flux, which is incident through the holes of photoresist pattern 110. Since the incident electron has an opposite direction to an electric field, it cannot maintain a uniform directivity and thus charges only an upper portion of an etching target layer with (−). Additionally, since ions are vertically incident with a high energy along an electric filed, they can be incident to a bottom portion of the etching target layer and charge the bottom surface with (+). By such a charging structure, an electric filed is formed inside the etching target layer, and a path of additionally-incident (+) ions becomes bent according to an electric field formed of (−) charges of the surface and (+) charges of the bottom. Therefore, the ions cannot reach the bottom.

Accordingly, an etching speed is reduced at the bottom. As an exposure region becomes narrower, an amount of ions arriving at the bottom is more reduced, such that an etch rate is also reduced. This is called an etching lag phenomenon. In accordance with embodiments, by using the etching lag phenomenon, as it approaches from device formation region A to ground region B, the depths d1, d2, d3 and d4 of trenches 105 increase. Accordingly, first trench 105a formed at device formation region A has a greater aspect ratio than fourth trench 105d formed at ground region B.

Figure 3:
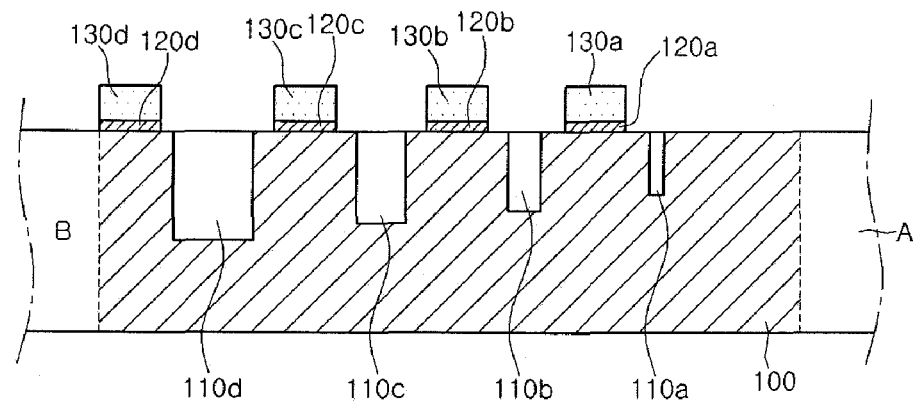

As illustrated in example FIG. 3, an insulation layer is formed on and/or over semiconductor substrate 100 to fill trenches 105, and is planarized to expose the uppermost surface of semiconductor substrate 100 in order to form a plurality of device isolation regions 110 including first device isolation region 110a, second device isolation region 110b, third device isolation region 110c and fourth device isolation region 110d. After forming device isolation regions 110, a well region may be formed, and then an oxide layer and a polysilicon layer are sequentially stacked thereon. Next, the oxide layer and the polysilicon layer are patterned to form a plurality of gate insulation layers 120 including first gate insulation layer 120a, second gate insulation layer 120b, third gate insulation layer 120c and fourth gate insulation layer 120d and gate electrodes 130 of an electrostatic protection device are formed on and/or over semiconductor substrate 100.

Figure 4:
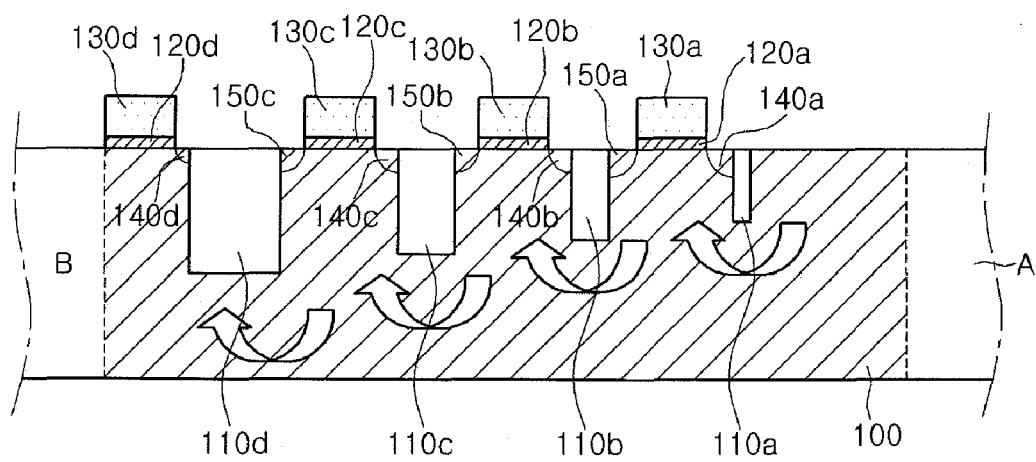

As illustrated in example FIG. 4, after forming gate electrodes 130, a plurality of source regions 140 including first source region 140a, second source region 140b, third source region 140c and fourth source region 140d and drain regions 150 including first drain region 150a, second drain region 150b and third drain region 150c are formed at the both sides of each gate electrode 130. In addition, an ion implantation process for controlling a threshold voltage, a lightly doped drain (LDD) region formation process, a sidewall formation process, and a spacer formation process may be performed, but descriptions thereof will be omitted in this embodiment.

Hereinafter, semiconductor device regions formed between the device isolation regions 110 may be referred to as first semiconductor device region 110a, second semiconductor device region 110b, third semiconductor device region 110c and fourth semiconductor device region 110d, respectively, in the order positioned from device formation region A to ground region B.

Hereinafter, an operation of an electrostatic protection device in accordance with embodiments will be described. Due to ESD, once an excessive current occurs in device formation region A, an overcurrent flows along the lower surface of first device isolation region 110a, and then flows through drain region 150a via the first semiconductor device region (i.e., first source region 140a and a channel region below first gate electrode 130a). A predetermined current is then applied to gate electrode 130a. Additionally, the overcurrent passing through the first semiconductor device region in accordance with a voltage level of the overcurrent flows through the second semiconductor device region via second device isolation region 110b.

Finally, when an overcurrent of a maximum voltage level occurs, it flows into ground region B via first device isolation region 110a, second device isolation region 110b, third device isolation region 110c and fourth device isolation region 110d and the fourth semiconductor device region. At this point, a predetermined current is applied to gate electrodes 130 of the first to fourth semiconductor device regions. The predetermined current applied to each gate electrode 130 can be measured using a signal. When an overcurrent of a minimum level occurs, a signal measured at each gate electrode 130 becomes "0001." When an overcurrent of the maximum level occurs, a signal measured at each gate electrode 130 becomes "1111." Accordingly, if an overcurrent does not occur, a signal measured at each electrode 130 becomes "0000".

Using the electrostatic protection device in accordance with embodiments, an overcurrent level can be divided based on the number of gate electrodes 130, device isolation regions 110 or semiconductor device regions. Additionally, the electrostatic protection device can effectively deal with an overcurrent of various voltage levels. Meaning, only whether an overcurrent occurs or not can be measured, but in accordance with embodiments, a level of the overcurrent can be detected by measuring signals of each gate electrode 130. Accordingly, when a complementary metal-oxide semiconductor (CMOS) device is realized in device formation region A, a latch-up phenomenon can be prevented, and only one kind of an electrostatic protection device in accordance with embodiments can be applied to various kinds of devices without preparing respectively different electrostatic protection devices.

Additionally, even when an overcurrent of an over voltage is applied, the first semiconductor device region is not damaged and then the overcurrent moves to the next stage by a sequential multi-level structure of the device isolation region 110. Therefore, reliability of the electrostatic protection device can be enhanced. Moreover, gate insulation layers 120, which are easily damaged by an overcurrent of an overvoltage, can be effectively protected. In addition, an electrostatic protection device undergoes a reliability test such as life testing during a product development state. In a case of the electrostatic protection device in accordance with embodiments, more accurate and precise reliability test can be performed.

The above method may be performed by first classifying an overcurrent by a level. Second, when an overcurrent of an arbitrary level is repeatedly applied, the number of the applied overcurrents corresponding to each process where measuring signals of the gate electrodes 130 change from "0000" to "1111" is counted. Third, a test of the second step is performed on an overcurrent of all levels. Fourth, by considering level types of an overcurrent, the number of the applied overcurrents at each measuring signal, rated voltage types of a device to be connected to the electrostatic protection device and the reliability of the electrostatic protection device can be evaluated. The reliability items include durability of the electrostatic protection device and types of applicable devices. Although durability can be tested by repeatedly applying an overcurrent and measuring whether an electrostatic protection device operates or not, in accordance with embodiments, since the degree of an internal damage according to various overcurrent levels can be measured again by each step, durability calculation becomes more accurate.

In addition, an electrostatic protection device having a multi-level series transistor structure is not manufactured through an additional process and is not formed on an external substrate region of a circuit device through a mounting process, but is formed in the same device region as the circuit device through a single semiconductor process. Accordingly, the integration degree of a device can be enhanced. Additionally, the electrostatic protection device in accordance with embodiments can effectively deal with overcurrents inputted from the external or internally occurring overcurrents. For example, an abnormal phenomenon occurring in a circuit device such as a CMOS IC is as follows. First, if an input/output (I/O) voltage exceeds a predetermined value or a voltage of a power supply terminal exceeds a predetermined voltage so that a circuit device is in a breakdown state, a latch-up phenomenon occurs. Once the circuit device is in a latch-up state, this situation is maintained until power supply is cut off by a thyristor structure. Second, an overcurrent occurring in a CMOS IC electrically contacts a PNPN junction part and is amplified into more than several hundreds of mA. A device becomes damaged. Third, during a device operation, an avalanche phenomenon occurs due to collision ionization, so that an overcurrent is generated and a device is damaged.

As mentioned above, in accordance with embodiments, characteristics of the electrostatic protection device can be accurately measured by a reliability test. Then, by reflecting the test result, the number of multi-level structures (that is, the number of gate electrodes 130) can be controlled, based on types of circuit devices to be applied or types of abnormal phenomena to be removed. Meaning, in accordance with embodiments, the number of device isolation regions 110, semiconductor device regions and gate electrodes 130 is four each, but if necessary, more than or less than four can be formed.

Accordingly, since a multi-level structure of a transistor can be formed through a single etching process, an electrostatic protection device of a high performance can be realized through a simple process. An overcurrent level can be finely classified by a plurality of semiconductor device regions divided by a plurality of device isolation regions, and it can effectively deal with an overcurrent of various voltage levels. Additionally, a level of an overcurrent can be detected using a measuring signal of a gate electrode. Moreover, only one type of an electrostatic protection device in accordance with embodiments can be applied to various kinds of circuit devices.

Additionally, the counteraction of the EPD in accordance with embodiments to an overcurrent of an overvoltage is enhanced through a sequential multi-level structure of a device isolation region. Therefore, the durability of an electrostatic protection device can be enhanced. The degree of internal damage to an electrostatic protection device in accordance with various overcurrent levels can be measured again by each stage. Therefore, the reliability test and durability calculation of an electrostatic protection devices can be more accurately performed.

The electrostatic protection device of a multi-level series transistor structure in accordance with embodiments can be formed in the same device region as a circuit device through a single semiconductor process. Therefore, the integration degree of a device can be enhanced. Additionally, the EPD can effectively deal with overcurrents input from the circuit device external or internally occurring overcurrents. Also, an overcurrent due to a latch-up phenomenon, a current amplification phenomenon of a thyristor, an avalanche phenomenon by collision ionization, and a breakdown voltage occurring phenomenon at a curvature interface can be effectively prevented.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing an electrostatic protection device comprising:
    forming a plurality of trenches over a semiconductor substrate at a predetermined depth, wherein the predetermined depth sequentially increases from a first region of the semiconductor substrate to a second region of the semiconductor substrate; and then
    forming a plurality of device isolation regions in the semiconductor substrate by filling the trenches with an insulation layer material; and then
    forming a plurality of gate electrodes spaced apart over the semiconductor substrate and between the adjacent device isolation regions; and then
    forming a plurality of source regions and drain regions in the semiconductor substrate at both lateral sides of each one of the gate electrodes.

2. The method of claim 1, wherein forming the plurality of trenches comprises:
    forming a plurality of photoresist patterns spaced apart a predetermined lateral distance over the semiconductor substrate to define a device isolation region, wherein the predetermined lateral distance sequentially increases from the first region of the semiconductor substrate to the second region of the semiconductor substrate; and then
    etching the plurality of trenches using the photoresist pattern as an etching mask; and then
    removing the photoresist patterns.

3. The method of claim 2, wherein the plurality of trenches are etched using a dry etching process.

4. The method of claim 3, wherein the dry etching process comprises reactive ion etching.

5. The method of claim 1, wherein the first region of the semiconductor substrate comprises a device formation region where a circuit device is to be connected to the electrostatic protection device and the second region of the semiconductor substrate comprises a ground region.

6. The method of claim 5, wherein the plurality of device isolation regions comprises a first device isolation region formed immediately adjacent to the device formation region of the semiconductor substrate, a second device isolation region laterally spaced immediately adjacent to the first device isolation region, a third device isolation region laterally spaced immediately adjacent to the second device isolation region and a fourth device isolation region laterally spaced immediately adjacent to the third device isolation region and the ground region of the semiconductor substrate.

7. The method of claim 6, wherein the plurality of device isolation regions comprises a first device isolation region formed immediately adjacent to the first region of the semiconductor substrate, a second device isolation region laterally spaced immediately adjacent to the first device isolation region, a third device isolation region laterally spaced immediately adjacent to the second device isolation region and a fourth device isolation region laterally spaced immediately adjacent to the third device isolation region and the second region of the semiconductor substrate.

8. The method of claim 1, wherein forming the plurality of gate electrodes comprises:
    sequentially forming an insulating layer and a polysilicon layer over the semiconductor substrate including device isolation regions; and then
    etching the insulating layer and the polysilicon layer to expose the device isolation regions.

9. An electrostatic protection device comprising:
    a semiconductor substrate having a first region and a second region;
    a plurality of device isolation regions formed in the semiconductor substrate at a predetermined width and a predetermined depth, wherein the predetermined width and the predetermined depth sequentially increases from the first region of the semiconductor substrate to the second region of the semiconductor substrate;
    a plurality of gate electrodes formed over the semiconductor substrate in spaces between adjacent ones of the device isolation regions; and
    a plurality of source regions and drain regions formed in the semiconductor substrate at both lateral sides of the gate electrode.

10. The electrostatic protection device of claim 9, wherein the first region of the semiconductor substrate comprises a device formation region where a circuit device is to be connected to the electrostatic protection device and the second region of the semiconductor substrate comprises a ground region.

11. The electrostatic protection device of claim 10, wherein the plurality of device isolation regions comprises a first device isolation region formed immediately adjacent to the device formation region of the semiconductor substrate, a second device isolation region laterally spaced immediately adjacent to the first device isolation region, a third device isolation region laterally spaced immediately adjacent to the second device isolation region and a fourth device isolation region laterally spaced immediately adjacent to the third device isolation region and the ground region of the semiconductor substrate.

12. The electrostatic protection device of claim 9, wherein the plurality of device isolation regions comprises a first device isolation region formed immediately adjacent to the first region of the semiconductor substrate, a second device isolation region laterally spaced immediately adjacent to the first device isolation region, a third device isolation region laterally spaced immediately adjacent to the second device isolation region and a fourth device isolation region laterally spaced immediately adjacent to the third device isolation region and the second region of the semiconductor substrate.

13. The electrostatic protection device of claim 9, further comprising a plurality of gate insulating layers interposed between the gate electrodes and the semiconductor substrate.

* * * * *